(12) United States Patent
Nygren

(10) Patent No.: US 12,300,346 B2
(45) Date of Patent: May 13, 2025

(54) HIGH-BANDWIDTH MEMORY MODULE ARCHITECTURE

(71) Applicant: Advanced Micro Devices, Inc., Santa Clara, CA (US)

(72) Inventor: Aaron John Nygren, Boise, ID (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 229 days.

(21) Appl. No.: 17/849,089

(22) Filed: Jun. 24, 2022

(65) Prior Publication Data

US 2023/0178121 A1 Jun. 8, 2023

Related U.S. Application Data

(60) Provisional application No. 63/314,856, filed on Feb. 28, 2022, provisional application No. 63/310,883, filed on Feb. 16, 2022, provisional application No. 63/286,342, filed on Dec. 6, 2021.

(51) Int. Cl.
*G11C 7/10* (2006.01)
*G11C 7/22* (2006.01)

(52) U.S. Cl.
CPC .......... *G11C 7/1039* (2013.01); *G11C 7/1048* (2013.01); *G11C 7/1063* (2013.01); *G11C 7/109* (2013.01); *G11C 7/222* (2013.01)

(58) Field of Classification Search
CPC ... G11C 7/1039; G11C 7/1048; G11C 7/1063; G11C 7/109; G11C 7/222
USPC .................................................... 365/189.05
See application file for complete search history.

(56) References Cited

U.S. PATENT DOCUMENTS

| 9,997,233 | B1* | 6/2018 | Ware | G11C 11/408 |
| 10,353,455 | B2* | 7/2019 | Mcilvain | G06F 9/4405 |
| 10,380,043 | B2* | 8/2019 | Morris | G06F 1/10 |
| 10,388,362 | B1* | 8/2019 | Hadrick | G11C 29/42 |
| 10,628,343 | B2* | 4/2020 | Lee | G06F 13/1673 |
| 10,636,476 | B2* | 4/2020 | Nale | G11C 11/4078 |
| 10,878,887 | B2* | 12/2020 | Ware | G11C 7/22 |
| 10,891,243 | B2* | 1/2021 | Morris | G06F 13/1663 |
| 11,068,151 | B2* | 7/2021 | Koyama | G06F 3/0488 |
| 11,068,161 | B1* | 7/2021 | Chen | G06F 13/105 |

(Continued)

OTHER PUBLICATIONS

International Search Report and Written Opinion for International Application No. PCT/US2022/048992, mailed Mar. 14, 2023, 8 pages.

*Primary Examiner* — Viet Q Nguyen
(74) *Attorney, Agent, or Firm* — Polansky & Associates, P.L.L.C.; Paul J. Polansky; Nathan H. Calvert

(57) ABSTRACT

A high-bandwidth dual-inline memory module (HB-DIMM) includes a plurality of memory chips, a plurality of data buffer chips, and a register clock driver (RCD) circuit. The data buffer chips are coupled to respective sets of the memory chips and transmit data from the memory chips over a host bus at a data rate twice that of the memory chips. The RCD circuit includes a host bus interface and a memory interface coupled to the plurality of memory chips. The RCD circuit implements commands received over the host bus by routing command/address (C/A) signals to the memory chips for providing at least two independently addressable pseudo-channels, the RCD circuit addressing each respective pseudo-channel based on a chip identifier (CID) bit derived from the C/A signals.

21 Claims, 15 Drawing Sheets

(56) References Cited

U.S. PATENT DOCUMENTS

| | | | | |
|---|---|---|---|---|
| 11,221,772 | B2* | 1/2022 | Brandl | G11C 11/4074 |
| 11,573,849 | B2* | 2/2023 | Giovannini | G06F 11/0772 |
| 11,809,345 | B2* | 11/2023 | Giovannini | G06F 13/1678 |
| 11,899,597 | B2* | 2/2024 | Ware | G06F 13/00 |
| 11,983,443 | B2* | 5/2024 | Hinkle | G06F 3/0658 |
| 2008/0170425 | A1* | 7/2008 | Rajan | G11C 11/4093 |
| | | | | 365/63 |
| 2010/0005212 | A1* | 1/2010 | Gower | G06F 13/4234 |
| | | | | 710/308 |
| 2016/0011813 | A1* | 1/2016 | Ellis | G06F 11/1048 |
| | | | | 714/763 |
| 2017/0206165 | A1* | 7/2017 | Lim | G11C 11/4076 |
| 2017/0278562 | A1 | 9/2017 | Nale | |
| 2018/0061478 | A1 | 3/2018 | Vergis et al. | |
| 2018/0225235 | A1 | 8/2018 | Lee | |
| 2019/0034344 | A1* | 1/2019 | Lim | G11C 16/32 |
| 2019/0095361 | A1* | 3/2019 | Morris | G06F 13/1663 |
| 2019/0243709 | A1 | 8/2019 | Meaney et al. | |
| 2020/0065266 | A1* | 2/2020 | Morris | G06F 13/1663 |
| 2020/0264782 | A1 | 8/2020 | Ware et al. | |
| 2022/0276958 | A1* | 9/2022 | Sethuraman | G11C 29/26 |
| 2023/0099474 | A1* | 3/2023 | Lee | G11C 5/025 |
| | | | | 257/686 |

* cited by examiner

| Rank | PC | 1RPCx4 | 1RPCx8 | 2RPCx8/x4 | QRx4 |
|---|---|---|---|---|---|
| 0 | PC0 | CS0 | CS0,CID=0 | CS0,CID=0 | CS0,CID=0 |
| | PC1 | CS1 | CS0,CID=1 | CS0,CID=1 | - |
| 1 | PC0 | - | - | CS1,CID=0 | CS1,CID=0 |
| | PC1 | - | - | CS1,CID=1 | - |
| 2 | - | - | - | - | CS0,CID=1 |
| 3 | - | - | - | - | CS1,CID=1 |

RPC=Rank Pseudo Channel

*FIG. 9*

| Signals | 2RPC DDR5-8800 MT/s (1N 2:1) | 2RPC DDR5-8800 MT/s (2N 2:1) | QR DDR5-8800 MT/s (2N 1:1) | Units |
|---|---|---|---|---|
| Host Interface Clock | 4400 | 2200 | 4400 | MHz |
| DRAM Interface Clock | 2200 | 2200 | 4400 | MHz |
| BCOM Interface Clock | 2200 | 2200 | 4400 | MHz |
| Host DQ rate | 8800 | 8800 | 8800 | MT/s |
| DRAM side DQ rate | 4400 | 4400 | 8800 | MT/s |
| DCA rate | 8800 | 4400 | 4400 | MT/s |
| QCA rate | 2200 | 1100 | 2200 | MT/s |
| DCS rate | 4400 | 2200 | 4400 (2200) | MT/s |
| QCS rate | 2200 | 2200 | 4400 (2200) | MT/s |
| BCS rate | 2200 | 2200 | 4400 (2200) | MT/s |
| BCOM bus rate | 2200 | 1100 | 2200 | MT/s |

FIG. 10

"Tall" module speed limitations

| MRCD/DB 'tall' module configurations | Achievable DQ rate* | MDQ | QCS | QCA |
|---|---|---|---|---|
| QR LRDIMM 2N | <6.4Gbps | <6.4Gbps | 3.2Gbps | 2.1Gbps |
| 2PRCx4 1N 2:1 | 8.4Gbps | 8.4Gbps | 3.2Gbps | 2.1Gbps |
| 2PRCx4 2N 2:1 | 16.8Gbps | 8.4Gbps | 3.2Gbps | 2.1Gbps |
| QR 2N 1:1 | 6.4Gbps | 8.4Gbps | 3.2Gbps | 2.1Gbps |
| QR 2N 1:1 gear | 8.4Gbps | 8.4Gbps | 3.2Gbps | 2.1Gbps |
| QR 1N 1:1 | 4.2Gbps | 8.4Gbps | 3.2Gbps | 2.1Gbps |
| QR 1N 1:1 gear | 4.2Gbps | 8.4Gbps | 3.2Gbps | 2.1Gbps |

* Speeds do not represent host-interface limitations
* Boxed values show weak link in final DQ speed Baseline w/o HB-DIMM → QR LRDIMM 2N
"Tall" configurations → 2PRCx4 1N 2:1 ... QR 1N 1:1 gear

| Capacity (16Gb) | DRAM (Gb,pkg) | Configuration | Raw Card |
|---|---|---|---|
| 32GB | 16 Planar | 1RPCx8 | 2Rx8 |
| 64GB | 16 Planar | 2RPCx8 | QRx8 |
| 64GB | 16 Planar | 1RPCx4 | 2Rx4 |
| 128GB | 16 3DS-2H | 2RPCx4 3DS | |
| 128GB | 16 Planar | 2RPCx4 | QRx4 |
| 128GB | 16 Planar | QRx4 | QRx4 |

RPC=Rank Pseudo Channel

HIGH-BANDWIDTH MEMORY MODULE ARCHITECTURE

This application claims priority to provisional application U.S. 63/314,856, filed Feb. 28, 2022, provisional application U.S. 63/310,883, filed Feb. 16, 2022, and provisional application U.S. 63/286,342, filed Dec. 6, 2021, the entire contents of each of which are incorporated herein by reference.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability.

However, while these enhancements have improved the speed of DDR memory used for computer systems' main memory, further improvements are desirable. In particular, because the memory bandwidth required for applications such as high-performance graphics processors and servers, which have multiple cores and a corresponding increase in bandwidth-per-core requirement, are outpacing the roadmap of bandwidth improvements for DDR DRAM chips. Improved DIMM architectures are needed to meet such requirements with current DDR chip technologies such as DDR5.

One such architecture is the load-reduced dual inline memory module (LRDIMM). LRDIMM is a load-reduction (LR) DIMM (typically employed in servers) that supports higher densities than existing DIMMs. An LRDIMM contains a memory buffer (MB) chip, rather than a register, in order to reduce the load on the memory bus. The memory buffer reduces each clock, command/address and data input to a single impedance load on the memory bus data line, which increases the memory speed.

Another proposed architecture for improving bandwidth performance is the high-bandwidth DIMM (HB-DIMM). This approach seeks to use the benefits of the high-bandwidth memory (HBM) format in a DIMM form-factor.

BRIEF DESCRIPTION OF THE DRAWINGS

FIG. 9 shows a table including various options available for configuration of HB-DIMMs according to various embodiments;

FIG. 10 shows a table including exemplary clock speeds and data rates for an HB-DIMM according to some embodiments;

FIG. 11 shows a table including exemplary speed limitations for various configurations of HB-DIMM according to various embodiments;

FIG. 12 shows a table including module configurations for various HB-DIMMs according to various embodiments;

Figure 1:
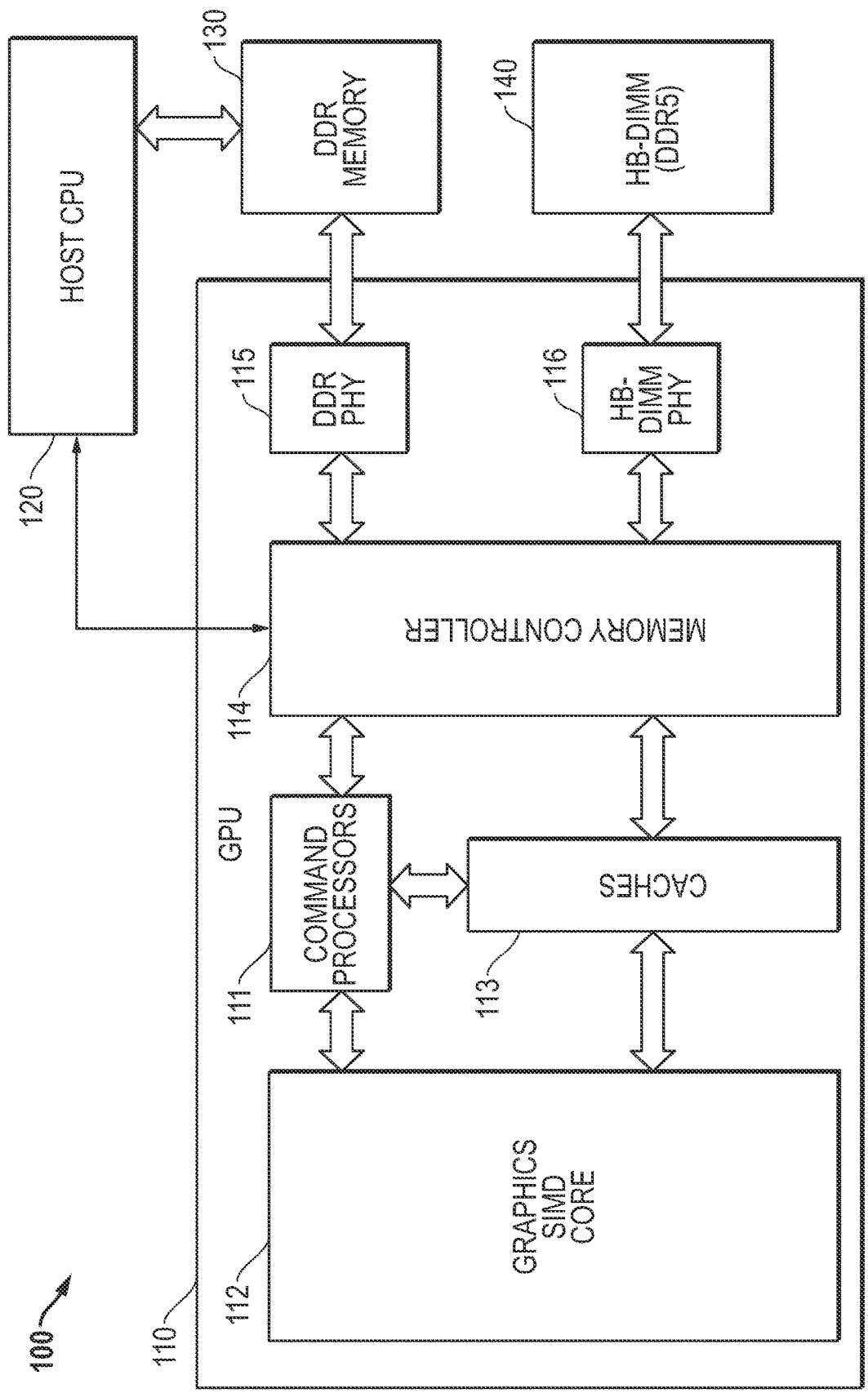
FIG. 1 illustrates in block diagram for a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A high-bandwidth dual-inline memory module (HB-DIMM) is adapted for coupling to a host bus and includes a plurality of memory chips, a plurality of data buffer chips, and a register clock driver (RCD) circuit. The plurality of data buffer chips are coupled to respective sets of the memory chips and capable of transmitting data from the memory chips over a host bus at a data rate twice that of the memory chips. The RCD circuit includes a host bus interface for coupling to the host bus and a memory interface coupled to the plurality of memory chips. The RCD circuit is capable of implementing memory access commands received over the host bus by routing command/address (C/A) signals to the memory chips for providing at least two independently addressable pseudo-channels, the RCD circuit addressing each respective pseudo-channel based on a chip identifier (CID) bit derived from the C/A signals.

A method for operating an HB-DIMM includes, at a register clock driver (RCD) circuit, receiving a memory access command over a memory interface bus. At the RCD circuit, the method includes routing command/address (C/A) signals for the memory access command to a selected memory chip in a plurality of memory chips for providing at least two independently addressable pseudo-channels, the RCD circuit addressing each respective pseudo-channel based on a chip identifier (CID) bit of the C/A signals. At the RCD circuit, the method includes preparing a data buffer command code indicating a pseudo-channel associated with a selected memory access command for which the command is to be fulfilled.

A data processing system includes a host bus, a memory controller, and an HB-DIMM. The memory controller is coupled to the host bus for fulfilling memory access commands over at least two independently addressable pseudo-channels. The HB-DIMM is coupled to the host bus and includes a plurality of memory chips, a plurality of data buffer chips, and a register clock driver. The plurality of data buffer chips are coupled to respective sets of the memory chips and capable of transmitting data from the memory chips over a host bus at a data rate twice that of the memory chips. The register clock driver (RCD) circuit includes a host bus interface for coupling to the host bus and a memory interface coupled to the plurality of memory chips The RCD circuit implements memory access commands received over the host bus by routing command/address (C/A) signals to the memory chips for the at least two independently addressable pseudo-channels. The RCD circuit addresses each respective pseudo-channel based on a chip identifier (CID) bit of the C/A signals.

FIG. 1 illustrates in block diagram for a data processing system 100 according to some embodiments. Data processing system 100 includes generally a data processor in the form of a graphics processing unit (GPU) 110, a host central processing unit (CPU) 120, a double data rate (DDR) memory 130, and a HB-DIMM memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (DDR PHY) 115, and a HB-DIMM PHY 116.

Command processors 111 are used to interpret high-level graphics instructions such as those specified in the OpenGL programming language. Command processors 111 have a bidirectional connection to memory controller 114 for receiving high-level graphics instructions such as OpenGL instructions, a bidirectional connection to caches 113, and a bidirectional connection to graphics SIMD core 112. In response to receiving the high-level instructions, command processors issue low-level instructions for rendering, geometric processing, shading, and rasterizing of data, such as frame data, using caches 113 as temporary storage. In response to the graphics instructions, graphics SIMD core 112 performs low-level instructions on a large data set in a massively parallel fashion. Command processors 111 and caches 113 are used for temporary storage of input data and output (e.g., rendered and rasterized) data. Caches 113 also have a bidirectional connection to graphics SIMD core 112, and a bidirectional connection to memory controller 114.

Memory controller 114 has a first upstream port connected to command processors 111, a second upstream port connected to caches 113, a first downstream bidirectional port to DDR PHY 115, and a second downstream bidirectional port to HB-DIMM PHY 116. As used herein, "upstream" ports are on a side of a circuit toward a data processor and away from a memory, and "downstream" ports are in a direction away from the data processor and toward a memory. Memory controller 114 controls the timing and sequencing of data transfers to and from DDR memory 130 and HB-DIMM 140. DDR memory has asymmetric accesses, that is, accesses to open pages in the memory are faster than accesses to closed pages. Memory controller 114 stores memory access commands and processes them out-of-order for efficiency by, e.g., favoring accesses to open pages, while observing certain quality-of-service objectives. DDR PHY 115 has an upstream port connected to the first downstream port of memory controller 114, and a downstream port bidirectionally connected to DDR memory 130. DDR PHY 115 meets all specified timing parameters of the version of DDR memory 130, such as DDR version five (DDR5), and performs timing calibration operations at the direction of memory controller 114. Likewise, HB-DIMM PHY 116 has an upstream port connected to the second downstream port of memory controller 114, and a downstream port bidirectionally connected to HB-DIMM 140. HB-DIMM PHY 116, in this embodiment, employs DDR5 DRAM chips and employs a new, high speed PHY interface standard in which data rates over the PHY are twice that of the memory chips, while the form factor and connectors of the HB-DIMM is compatible with existing LRDIMM specifications. HB-DIMM 140 includes a set of mode registers 141 programmable over the HB-DIMM PHY 116 to configure HB-DIMM 140 for operation.

In operation, data processing system can be used as a graphics card or accelerator because of the high bandwidth graphics processing performed by graphics SIMD core 112. Host CPU 120, running an operating system or an application program, sends graphics processing commands to GPU 110 through DDR memory 130, which serves as a unified memory for GPU 110 and host CPU 120. It may send the commands using, for example, as OpenGL commands, or through any other host CPU to GPU interface. OpenGL was developed by the Khronos Group, and is a cross-language, cross-platform application programming interface for rendering 2D and 3D vector graphics. Host CPU 120 uses an application programming interface (API) to interact with GPU 110 to provide hardware-accelerated rendering.

Figure 2:
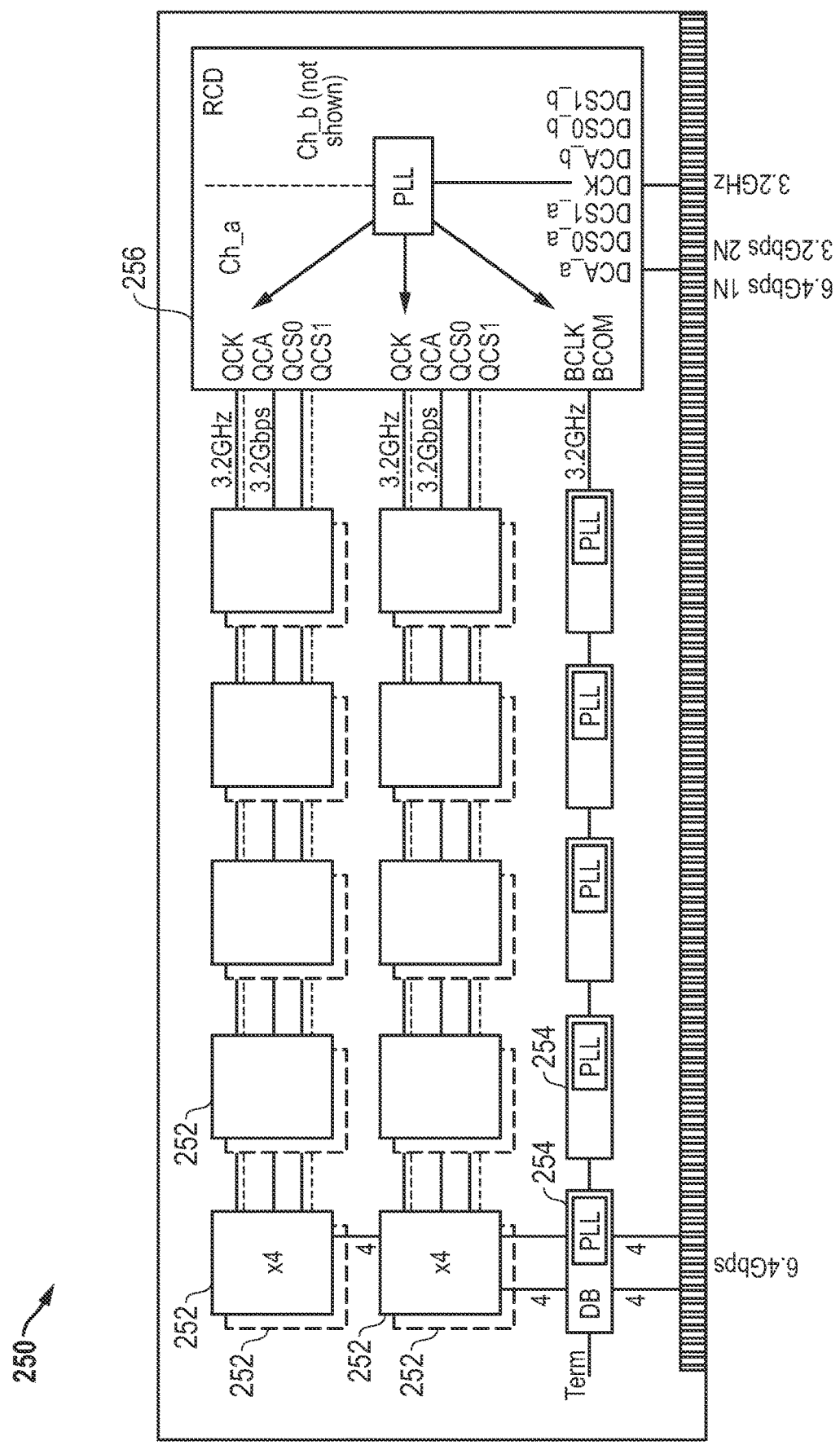
FIG. 2 illustrates in block diagram form a DDR5 load-reduced dual-inline memory module (LRDIMM) according to the prior art.

FIG. 2 illustrates in block diagram form a DDR5 load-reduced dual-inline memory module (LRDIMM) 250 ("LRDIMM 250") according to the prior art. LRDIMM 250 is generally embodied on a printed circuit board (PCB) or other module format and includes a number of DRAM chips 252, a number of data buffers (DBs) 254, and a register clock driver (RCD) 256.

Depicted are operating speeds for the data (DQ) lines of the memory bus (6.4 Gbps), the host clock DCK (3.2 GHz), and the command/address ("DCA_a") lines operating in a "1N" mode at 6.4 Gbps or a "2N" mode at 3.2 Gbps. There are four ranks of DRAM chips 252, and DBs 254 cooperate with RCD buffer 256 allow LRDIMM 250 to appear as a dual-rank DIMM to the system by isolating the electrical loading of DRAM chips 252 from the memory bus. As can be seen, LRDIMM 250 transmits and receives data over the memory bus at the speed of the DRAM chips (6.4 Gbps) and does not provide for increased memory bandwidth. Data and C/A signaling are sent at a 1:1 ratio to the speeds employed in the DDR5 standard. RCD 256 and DBs 254 do not handle quad-rank logic or timings.

Figure 3:
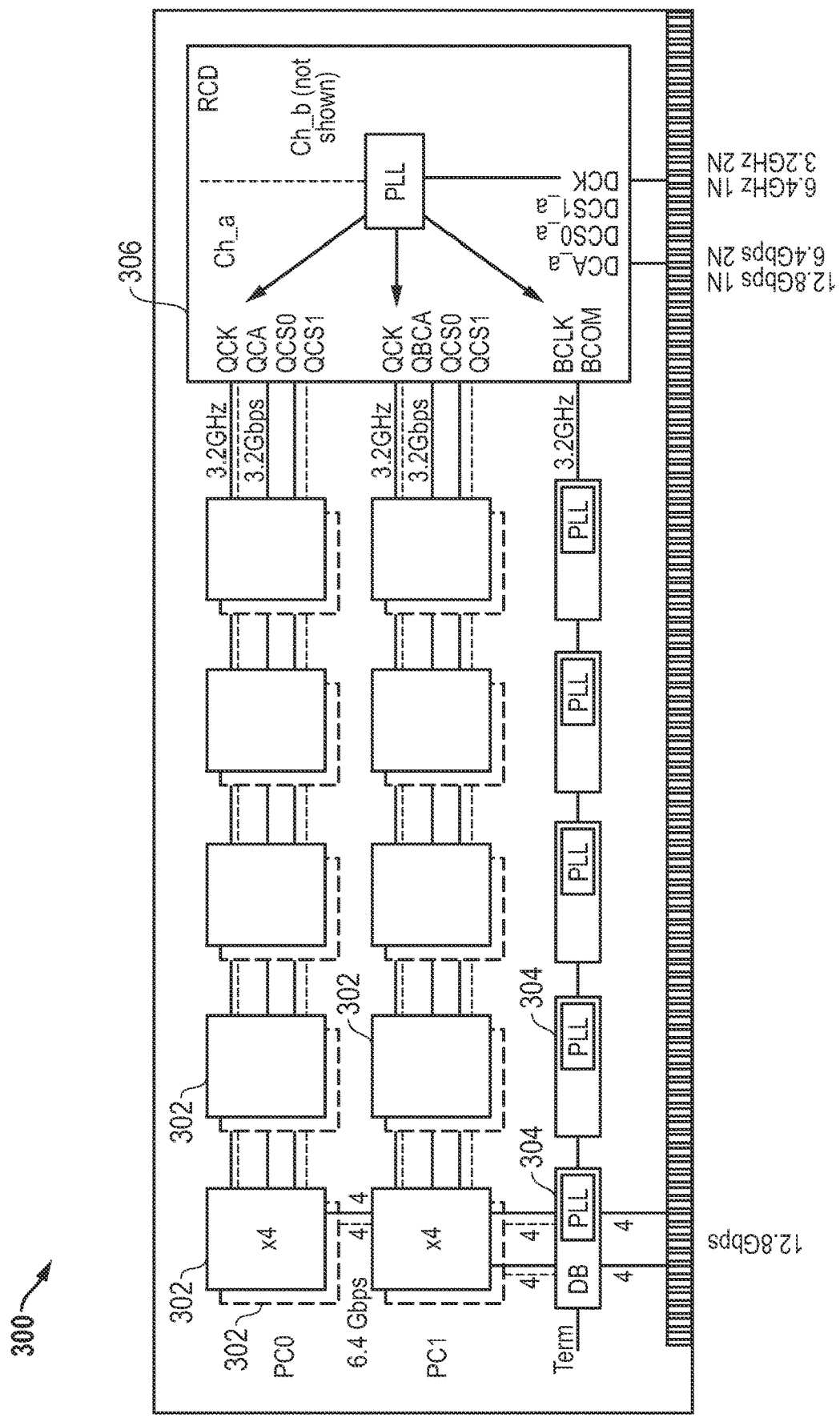
FIG. 3 illustrates in block diagram form a high-bandwidth DIMM (HB-DIMM) according to some embodiments.

FIG. 3 illustrates in block diagram form a high-bandwidth DIMM (HB-DIMM) 300 according to some embodiments. HB-DIMM 300 is embodied on a PCB or other module format and includes a number of DRAM chips 302, a number of data buffers (DBs) 304, and a register clock driver (RCD) 306, interfacing to the memory bus over pins generally depicted along the bottom of the module. HB-DIMM 300 includes two independently addressable pseudo-channels labelled "PC0" and "PC1". Generally, HB-DIMM 300 provides a data (DQ) rate of 12.8 Gbps in this embodiment, twice the data rate of DRAM chips 302 (6.4 Gbps). Depicted is an "x4" configuration including one physical rank (only half of a module, one side of the HB-DIMM, is shown), while an "x8" configuration with two physical ranks is used in some other embodiments as shown by the dotted lines showing an additional rank of DRAM chips 302.

As shown, pseudo-channels PC0 and PC1 connect to DBs 304 with a separate 6.4 Gbps link of 4 pins, with 8 data pins connecting to each DB 304. DBs 304, therefore, are able to provide a 12.8 Gbps capacity over the memory bus. RCD 306 circuit includes a memory bus (host memory bus) interface for coupling to the memory bus and a memory interface connected to each of DRAM chips 302. RCD 306 is capable of implementing memory access commands received over the host bus by routing command/address (C/A) signals to the DRAM chips for providing at least two independently addressable pseudo-channels. RCD 306 addresses each respective pseudo-channel based on a chip identifier (CID) bit derived from the C/A signals.

HB-DIMM 300 has operating speeds for the data (DQ) lines of the memory bus of 12.8 Gbps, while the command/address ("DCA_a") lines operate in a "1N" mode at 12.8 Gbps or a "2N" mode at 6.4 Gbps. In this implementation, the host clock DCK is also able to operate more slowly in 2N mode, a capability not provided by LRDIMM or other prior DDRx DIMMS, with DCK operating at 6.4 GHZ in 1N mode, but operating at 3.2 GHz in 2N mode, a 2:1 ratio to the data rate on the DCA lines. This 2N mode for the DCK is enabled by clocking the C/A bus at a double data rate rather than a single data rate as is employed in LRDIMMs, for example.

Figure 4:
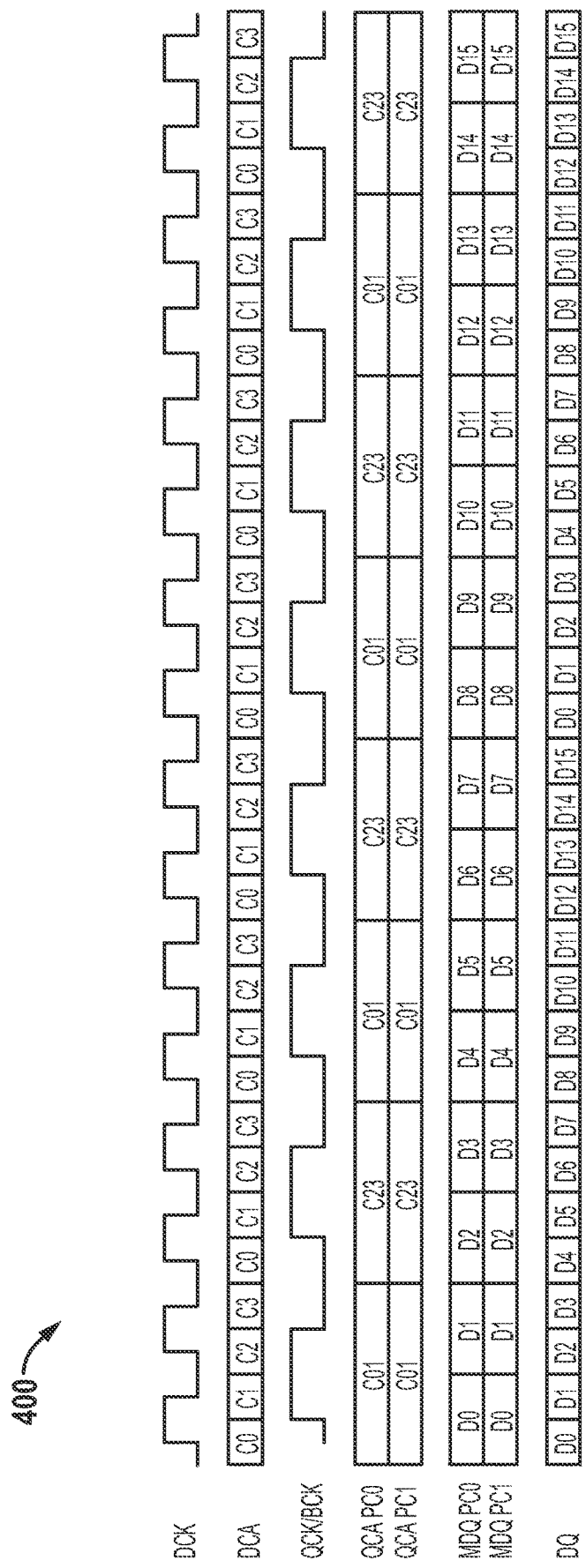
FIG. 4 shows a timing diagram showing a number of signals depicting operation of the HB-DIMM of FIG. 3.

FIG. 4 shows a timing diagram 400 showing a number of signals depicting operation of the HB-DIMM 300 of FIG. 3. The horizontal axis depicts time. Shown are a host clock signal "DCK", a C/A command sequence "DCA", a local clock signal and buffer command bus clock signal labelled "QCK/BCK", a C/A command sequence for PC0 labelled "QCA PC0", a C/A sequence for PC1 labelled "QCA PC1", a data sequence for PC0 labelled "MDQ PC0", a data sequence for PC1 labelled "MDQ PC1", and a data sequence for the memory bus data (DQ) lines labelled "DQ". Commands and data for PC1 are shown with a hatched background in diagram 400. Bytes or commands in the various sequences are labeled with "C" and their ordinal number, while data bytes are labeled with "D" and their ordinal number.

While other proposed HB-DIMM architectures transmit and receive data interleaved in time between the pseudo-channels, the depicted scheme keeps 64-byte data responses together, as shown in data sequence DQ. This scheme provides simplified signaling and enables the optional use of a "2N" C/A signaling mode supported by DDR5 DRAM chips as further described below.

Figure 5:
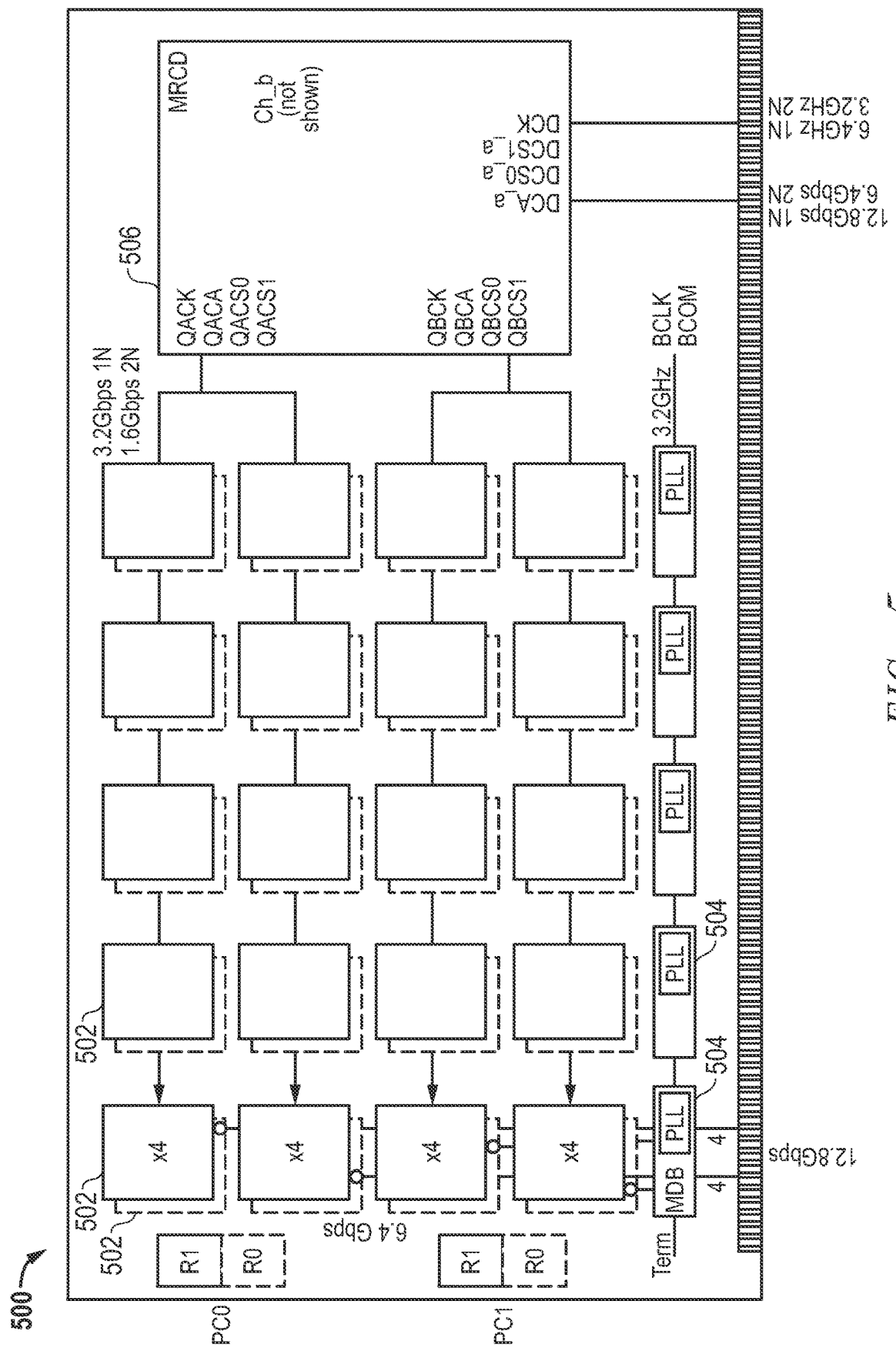
FIG. 5 illustrates in block diagram form an HB-DIMM according to some other embodiments.

FIG. 5 illustrates in block diagram form a high-bandwidth DIMM (HB-DIMM) 500 according to some embodiments. HB-DIMM 500 is embodied on a PCB or other module format and includes a number of DRAM chips 502, a number of module data buffers (MDBs) 504, and a module register clock driver (MRCD) 506, interfacing to the memory bus over pins generally depicted along the bottom of the module. HB-DIMM 500 includes two independently addressable pseudo-channels labelled "PC0" and "PC1", with two ranks in pseudo-channel PC0 labeled "R0" and "R1", and two ranks in pseudo-channel PC1 labeled "R0" and "R1".

Generally, HB-DIMM 500 provides a data (DQ) rate of 12.8 Gbps in this embodiment, twice the data rate of DRAM chips 502 (6.4 Gbps).

As shown, pseudo-channels PC0 and PC1 connect to MDBs 504 with a separate 6.4 Gbps link of 8 pins, with 16 data pins connecting to each MDB 504. MDBs 504, therefore, are able to provide a 12.8 Gbps capacity over the memory bus. MRCD 506 is a circuit that includes a memory bus (host memory bus) interface for coupling to the memory bus and a memory interface connected to each of DRAM chips 502. MRCD 506 is capable of implementing memory access commands received over the host bus by routing command/address (C/A) signals to the DRAM chips for providing at least two independently addressable pseudo-channels. MRCD 506 addresses each respective pseudo-channel based on a chip identifier (CID) bit derived from the C/A signals.

HB-DIMM 500 has operating speeds for the data (DQ) lines of the memory bus (12.8 Gbps), the command/address ("DCA_a") lines operating in a "1N" mode at 12.8 Gbps or a "2N" mode at 6.4 Gbps, and the host clock DCK supports a slower speed in the 2N mode, as described with respect to FIG. 4, by using double data rate clocking for the C/A bus (6.4 GHZ in 1N mode with single data rate clocking, and 3.2 GHz in 2N mode with double data rate clocking).

HB-DIMM 500 has a number of advantages over a similarly sized LRDIMM. First, the data lines from DRAM chips 502 to MDBs 504 do not require decision feedback equalization (DFE) for higher frequencies of operation because the QCA, QCS, and QCK signals from MRCD 506 to DRAM chips 502 are clocked more slowly than comparable signals on an LRDIMM, as shown by the depicted frequencies of 3.2 Gbps in 1N mode and 1.6 Gbps in 2N mode. Second, 1N frequencies for expected end-of-life (EOL) operating frequencies of the DDR5 standard are achievable for the QCA, QCS, and QCK signals because of the number of loads on each signal leaving MRCD 506 (QCA has 20 loads in this arrangement, and QCS and QCK both have 10 loads), while such frequencies are not achievable with an LRDIMM configuration because of the increased number of loads. Third, both MRCD 506 and MDBs 504 are configured to implement both two-rank per channel logic and timing control, or quad-rank logic and timing control, allowing HB-DIMM 500 to be configured with quad-ranks and no pseudo channels (as shown in FIG. 6).

Figure 6:
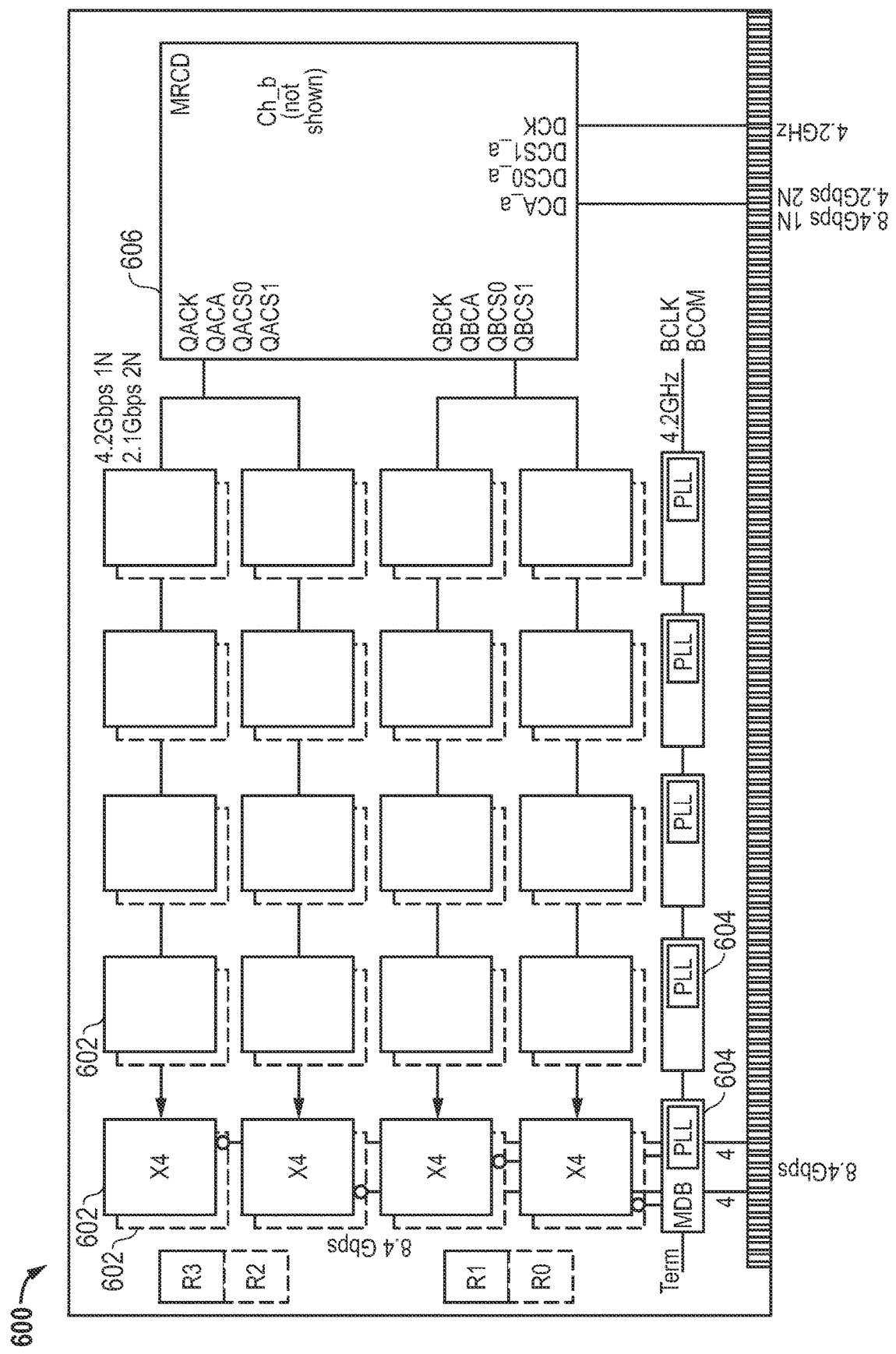
FIG. 6 illustrates in block diagram form an HB-DIMM according to some other embodiments.

FIG. 6 illustrates in block diagram form a high-bandwidth DIMM (HB-DIMM) 600 according to some embodiments. HB-DIMM 600 illustrates an HB-DIMM 500 of FIG. 5 configured in a quad-rank mode. HB-DIMM 600 is embodied on a PCB or other module format and includes a number of DRAM chips 602, a number of data buffers (MDBs) 604, and a module register clock driver (MRCD) 606, interfacing to a memory bus over pins generally depicted along the bottom of the module. Generally, HB-DIMM 600 provides a data (DQ) rate of 8.4 Gbps in this embodiment, twice the data rate of DRAM chips 602 (4.2 Gbps).

As shown, the quad-rank mode connects four ranks of DRAM chips 602 (labelled "R0", "R1", "R2", and "R3"), to MDBs 604 with a separate 4.2 Gbps link of 4 pins, for a total of 16 data pins connecting to each MDB 604. MRCD 606 circuit includes a memory bus (host memory bus) interface for coupling to the memory bus and a memory interface connected to each of DRAM chips 602. MRCD 606 is capable of implementing memory access commands received over the host bus by routing command/address (C/A) signals to the DRAM chips 601 for implementing a quad-rank signaling arrangement, and represents a programmable configuration of HB-DIMM 500 (FIG. 5). Both MRCD 606 and MDBs 604 are programmable to operate in the depicted quad-rank format or the dual-channel format of FIG. 5.

Figure 7:
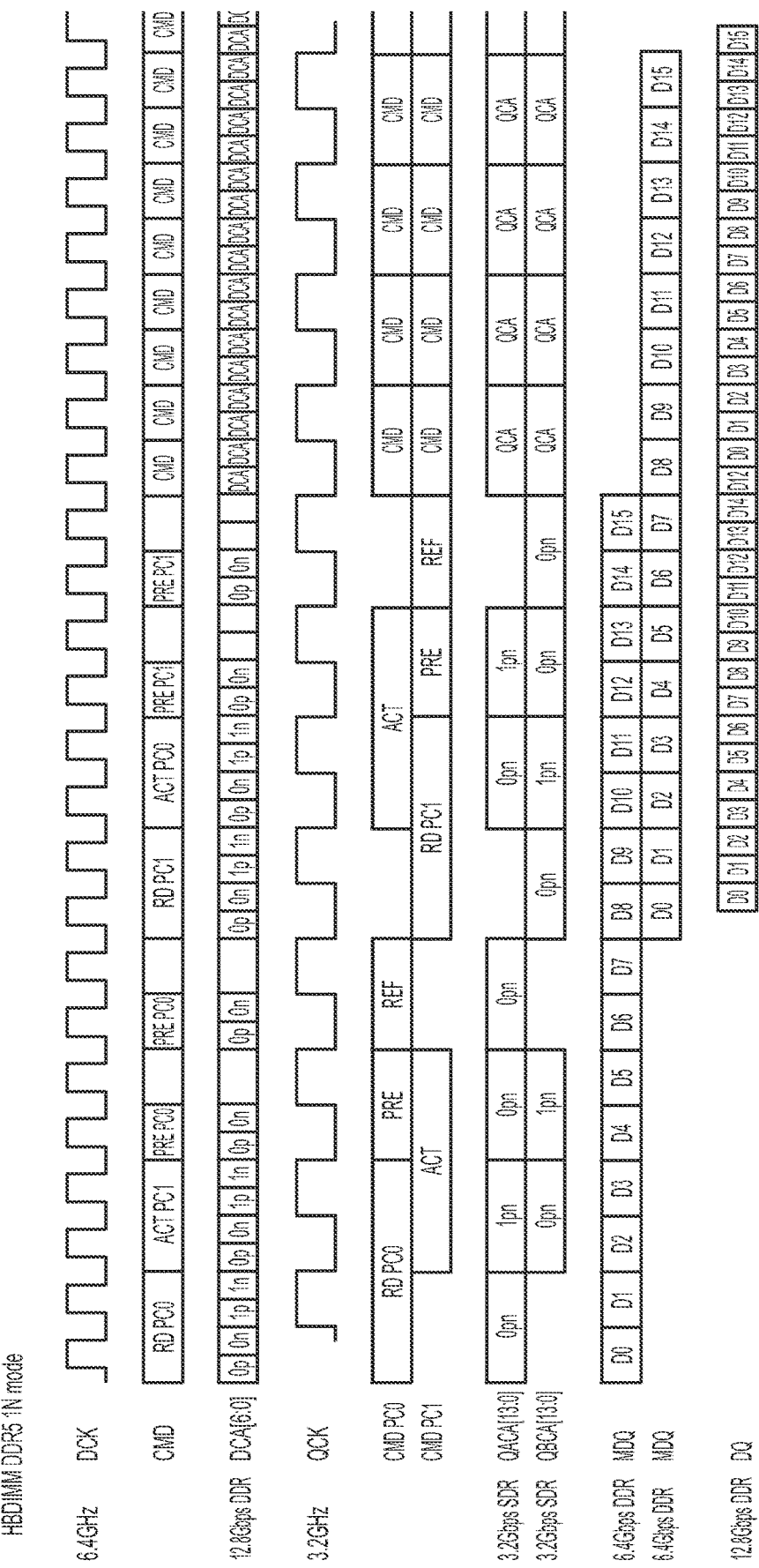
FIG. 7 shows a timing diagram illustrating a number of signals depicting operation of the HB-DIMM of FIG. 5 in a 1N mode of operation.

FIG. 7 shows a timing diagram 700 illustrating a number of signals depicting operation of the HB-DIMM 500 of FIG. 5 in a 1N mode of operation. The first column shows the clock speed or data rate for each signal, and the second column shows the signal name. Shown are a host clock signal "DCK", a command sequence labelled "CMD", a host to MRCD C/A command sequence "DCA[6:0]", a local MRCD clock signal to the DRAM chips labelled "QCK", a command sequence for PC0 labelled "CMD PC0", a command sequence for PC1 labelled "CMD PC1", a data sequence from the MRCD to the DRAM chips of PC0 labelled "QACA[13:0]", a data sequence from the MRCD to the DRAM chips of PC0 labelled "QBCA[13:0]", a data sequence from the DRAM chips of PC0 to the MDB labelled "MDQ", another data sequence from the DRAM chips of PC1 to the MDB labelled "MDQ", and a data sequence for the memory bus data (DQ) lines labelled "DQ". Data bytes are labeled with "D" and their ordinal number.

Figure 8:
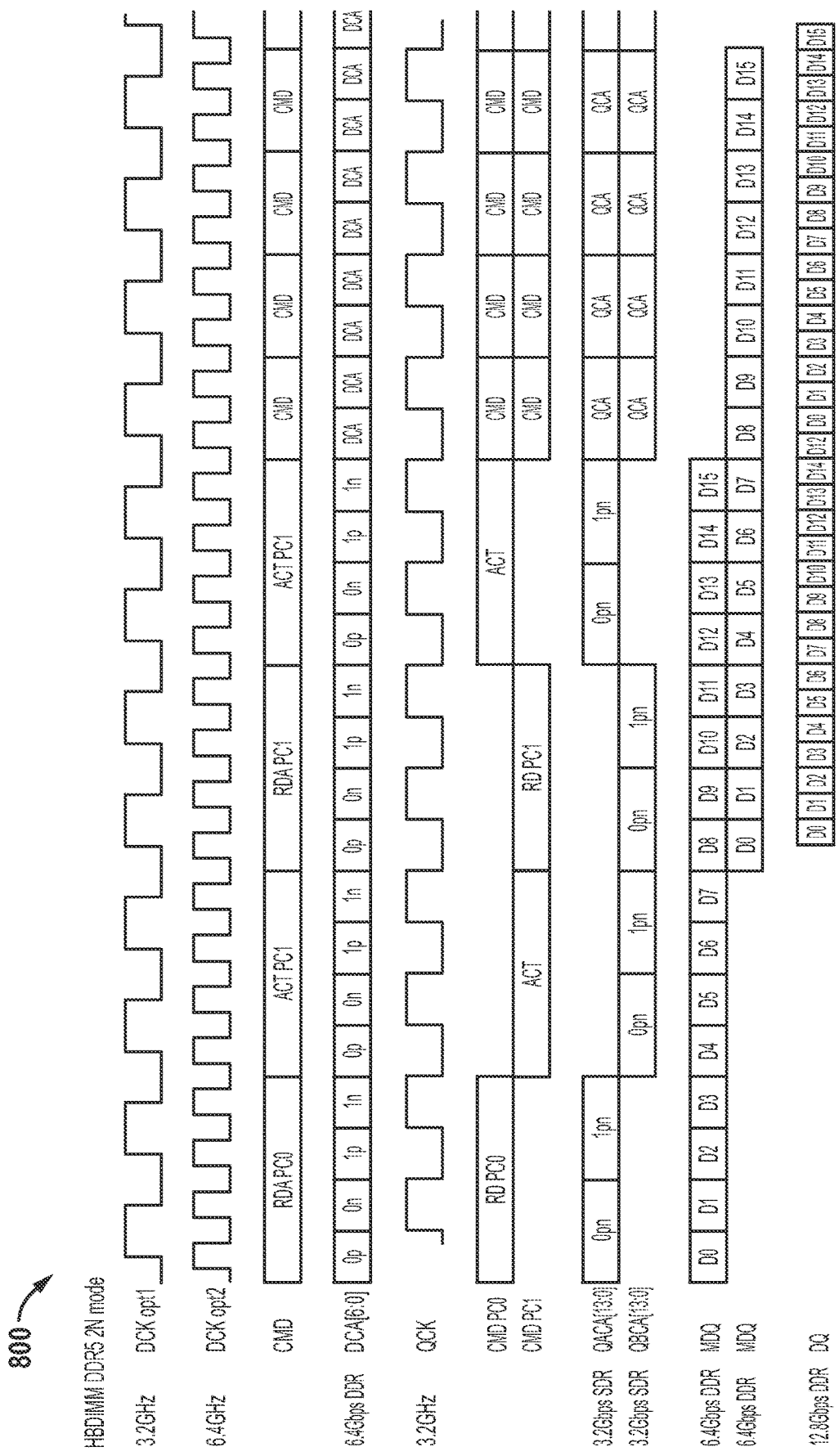
FIG. 8 shows a timing diagram illustrating a number of signals depicting operation of the HB-DIMM of FIG. 5 in a 2N mode of operation.

FIG. 8 shows a timing diagram 800 illustrating a number of signals depicting operation of the HB-DIMM 500 of FIG. 5 in a 2N mode of operation. The signal names are the same as those of FIG. 7. Depicted are two options for frequency of the DCK clock, labelled "DCK opt1" and "DCK opt2". For DCK opt1, the DCK frequency of DCK is half that of DCK opt2 at 3.2 GHz in this example, versus 6.4 GHz. For DCK opt1, the C/A bus is clocked at a double data rate, at a 1:1 ratio to QCK, while for DCK opt2, the C/A bus is clocked at a single data rate.

FIG. 9 shows a table 900 including various options available for configuration of HB-DIMMs according to various embodiments. Options are shown for using combinations of chip select values ("CS") and chip identifier ("CID") values for accessing ranks of DRAM chips on the modules in various configurations. Shown are three configurations with two pseudo-channels "PC0" and "PC1", and a quad-rank configuration without pseudo-channels. The first column lists the rank of DRAM chips, and the second column lists the pseudo-channel ("PC").

A 1 rank-per-channel ("RPC") with 4 data lines per DRAM chip ("1RPCx4") uses CS0 and CS1 to select between pseudo-channels. A configuration with 1 RPC and 8 data lines per DRAM chip ("1RPCx8") uses CS0 and CID values of 0 or 1 to select between pseudo-channels. A 2 RPC with 8 data lines per DRAM chip configuration ("2RPCx8") uses CS0 and CID values of 0 or 1 to select between pseudo-channels on Rank 0, and CS1 with CID values of 0 or 1 to select between pseudo-channels on Rank 1. The quad-rank with 4 data lines per DRAM chip ("QRx4") configuration uses CS0, CS1, and CID values of 0 or 1 to select between ranks.

FIG. 10 shows a table 1000 including exemplary clock speeds and data rates for an HB-DIMM according to some embodiments. The depicted configurations are shown for an 8800 MT/s (mega-transfers/second) capability HB-DIMM implemented like that of FIG. 5. The first column lists the signal or data rate. The second column shows speeds for a two RPC HB-DIMM in a 1N mode with a 2:1 ratio of QCK to DCK (i.e., FIG. 7). The third column shows speeds for a two RPC HB-DIMM in 2N mode with a 2:1 ratio of QCK to DCK (i.e., FIG. 8 DCK opt1). The fourth column shows speeds for a QR HB-DIMM in 2N mode with a 1:1 ratio of QCK to DCK (i.e., FIG. 8, DCK opt1). The configurable 2N mode allows for greater timing margins in systems where C/A timing is challenging, allowing DDR5 DRAM chips to be used in a variety of high-capacity DIMM modules that help extend the useful lifetime of the DDR5 standard.

FIG. 11 shows a table 1100 including exemplary speed limitations for various configurations of HB-DIMM according to various embodiments. The first row shows values for a QR LRDIMM (without HB-DIMM features) as a baseline for comparison. The other rows show HB-DIMM configurations including a set of high-capacity, or "Tall", configurations labelled on the left. Configurations labelled "gear" include a gear-down mode in which the HB-DIMM is configurable to cause the DRAM Address/Command bus to use every other rising clock of the DDR5 memory bus clock. In the quad-rank (QR) Tall configuration, no pseudo-channels are used, and a preferred implementation employs the CID bit to map addresses to ranks on the module.

FIG. 12 shows a table 1200 including module configurations for various HB-DIMMs according to various embodiments. The final two rows show module configurations enabled by the techniques herein, including modules providing quad-rank (QR) capability. As can be understood from the variety of speed and capacity options shown in FIGS. 9-13, the techniques herein allow flexible configuration for a variety of modes that accommodate different application requirements.

Figure 13:
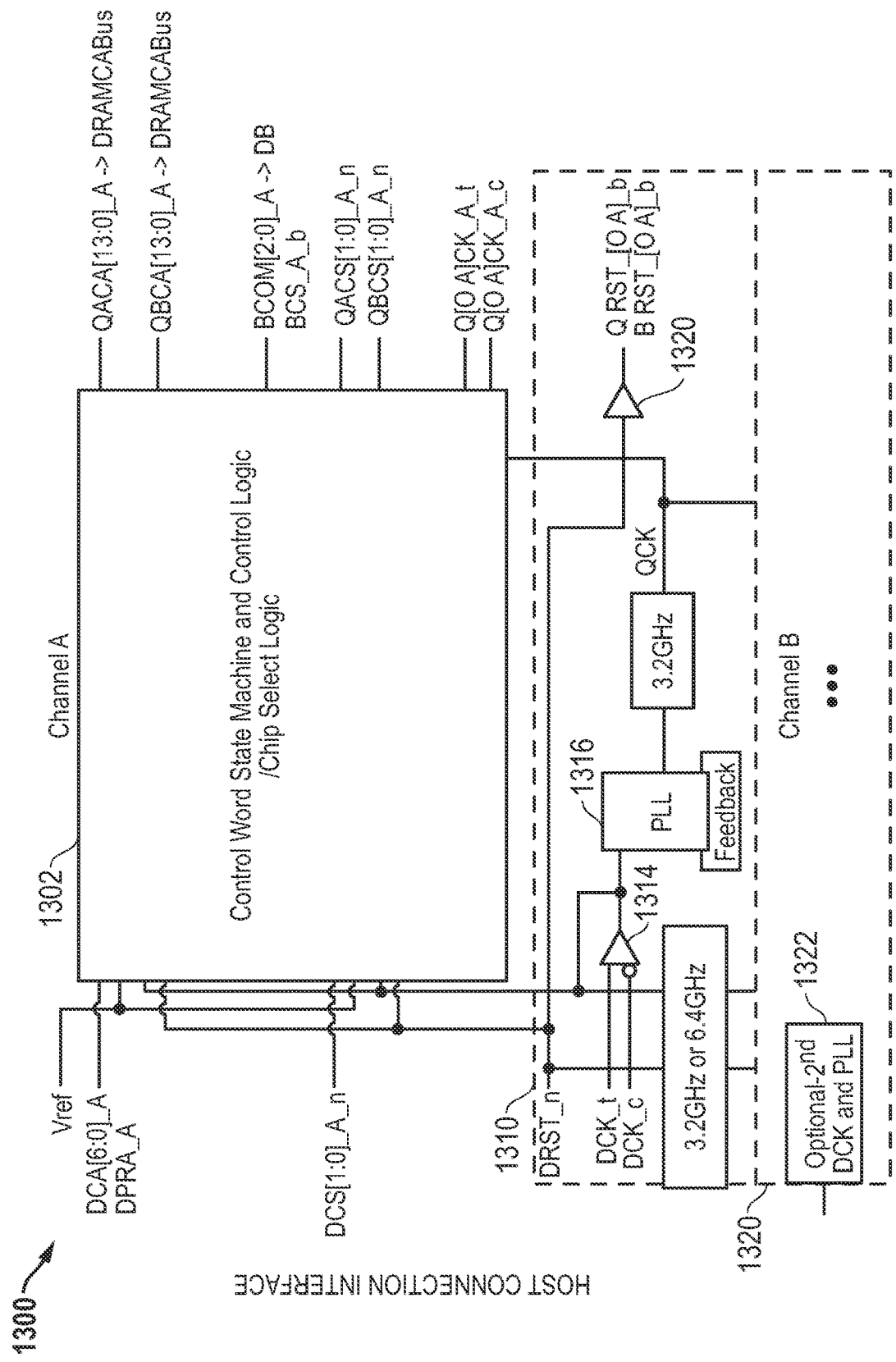
FIG. 13 illustrates in block diagram form a module register clock driver (MRCD) according to some embodiments.

FIG. 13 illustrates in block diagram form a module register clock driver (MRCD) 1300 according to some embodiments. MRCD 1300 is generally embodied as an RCD chip on an HB-DIMM module, and is suitable for use in the HB-DIMMs of FIG. 3, FIG. 5, FIG. 6, FIG. 16, and other HB-DIMM module configurations herein.

MRCD 1300 includes a reference voltage input labelled "Vref", C/A bus and parity input labelled "DCA[6:0]_A, DPAR_A", a chip select input labelled "DCS[1:0]_A_n", a reset input labelled "DRST_n", a differential pair of DCK inputs labelled "DCK_t" and "DCK_c", a first DRAM C/A output labelled "QACA[13:0]_A", a second DRAM C/A output labelled "QBCA[13:0]_A", a buffer command bus output labelled "BCOM[2:0]_A, BCS_A_n", a first DRAM chip select output labeled "QACS[1:0]_A_n", a second DRAM chip select output labeled "QBCS[1:0]_A_n", a pair of differential back side QCK clock outputs labeled "Q(O A)CK_A_t" and "Q(O A)CK_A_c", and a reset output labeled "QRST_[0 A]_n, BRST_[0 A]_n". Generally, MRCD 1300 includes an RCD for a first pseudo-channel labeled "Channel A", and an MRCD 1320 for a second pseudo-channel labeled "Channel B". The Channel A RCD includes a control word state machine with control logic and chip select logic ("state machine 1302"), a clock circuit 1310.

State machine 1302 includes a host bus interface which receives C/A bus and parity input DCA[6:0]_A, DPAR_A and chip select input DCS[1:0]_A_n. State machine 1302 also includes an input receiving a clock signal QCK from clock circuit 1310. The first DRAM C/A output QACA[13:0]_A and the first DRAM chip select output QACS[1:0]_A_n are connected to a first rank of DRAM chips (for example, R0 of PC0, FIG. 5), and the second DRAM C/A output QBCA[13:0]_A and second DRAM chip select output QBCS[1:0]_A_n are connected to a second rank of DRAM chips (for example, R1 of PC0, FIG. 5). Buffer command bus output BCOM[2:0]_A, BCS_A_n is connected to connected to the HB-DIMM's MDBs (for example, 504, FIG. 5).

Clock circuit 1310 receives reset input "DRST_n" and differential DCK inputs labelled "DCK_t" and "DCK_c", and produces clock signal QCK which is fed to state machine 1302 and, optionally, to another identical state machine for Channel B. Clock circuit 1310 includes a differential receiver 1314 and a phase-locked loop (PLL) 1316. In operation, differential receives 1314 receives a differential clock signal DCK from the host memory bus, which is fed to an input of PLL 1316. The output of PLL 1316 provides the QCK (back side) clock for operating the MRCDs and DBs of the HB-DIMM. As depicted by the labels, PLL 1316 is configurable to operate in two modes, one in which the DCK and QCK clock signals have a 2:1 ratio, and one in which they have a 1:1 ratio. In the 2:1 mode, PLL 1316 acts as a clock divider. While example DCK frequencies of 3.2 GHz and 6.4 GHz are shown, these ratios are used for embodiments with various frequencies of DCK.

MRCD 1320 for Channel B generally includes a second state machine 1302 also receiving the Vref input, C/A bus and parity input "DCA[6:0]_A, DPAR_A", chip select input "DCS[1:0]_A_n", and reset input labelled "DRST_n" from the host controller interface. As shown, an optional $2^{nd}$ DCK may be received as an input if the host interface supports separate DCK signals for the different pseudo-channels. In such implementations, a second clock circuit 1310 is present for Channel B, producing its own QCK signal for driving the DRAM chips for the second pseudo-channel.

In operation, MRCD 1300 implements memory access commands received over the host bus through the host connector interface by routing command/address (C/A) signals to the memory chips for providing at least two independently addressable pseudo-channels, the RCD circuit addressing each respective pseudo-channel based on a chip identifier (CID) bit derived from the C/A signals. In various implementations, state machine 1302 interprets and remaps a selected CID bit of the C/A signals for producing the output signals to access DRAM chips according to the configurations discussed above. State machine 1302 also produces the MDB command signals for the HB-DIMM data buffers to correctly provide results of memory access commands to each pseudo channel (for configurations with multiple pseudo-channels) or to each rank (for quad-rank configurations), as further described below with respect to FIG. 14. Specifically, MRCD 1300 produces and transmits a command code to the MDBs indicating a pseudo-channel selection for a memory access command based on the CID bit for the memory access command. MRCD 1300 also includes a differential driver (not shown) for producing the QCK clock outputs Q(O A)CK_A_t and Q(O A)CK_A_c for operating the DRAM chips of the HB-DIMM.

As depicted in the timing diagrams of FIG. 4, FIG. 7, and FIG. 8, MRCD 1300 does not re-order memory access commands received over the host bus, but instead provides responses for each pseudo-channel in order. MRCD 1300 causes read responses for the at least two pseudo-channels to be transmitted over the data bus in a non-interleaved format. In some implementations, MRCD 1300 is programmable to operate in a first mode in which a data clock (DCK) and C/A pins of the host bus operate at a half-rate (2N) speed with the C/A pins operated in a double-data-rate (DDR) mode, and a second mode in which the DCK and C/A pins of the host bus operate at a full-rate (1N) speed with the C/A pins of the host bus operated in a single-data-rate (SDR) mode.

In some implementations, MRCD 1300 supports a directed refresh management (DRFM) command by translating a precharge per-bank (PREpb) signal to a precharge per-bank signal for a first one of the pseudo-channels, and translating a signal on a reserved for future use (RFU) bit derived from the C/A signals to a PREpb signal for a second one of the pseudo-channels.

In some implementations, MRCD 1300 is programmable to operate in a quad-rank configuration in which it implements memory access commands received over the host bus by routing C/A signals to the memory chips in a quad-rank (QR) format. In such cases, a CID bit and chip select signals are mapped to logical ranks of DRAM chips as shown, for example, in FIG. 9.

Figure 14:
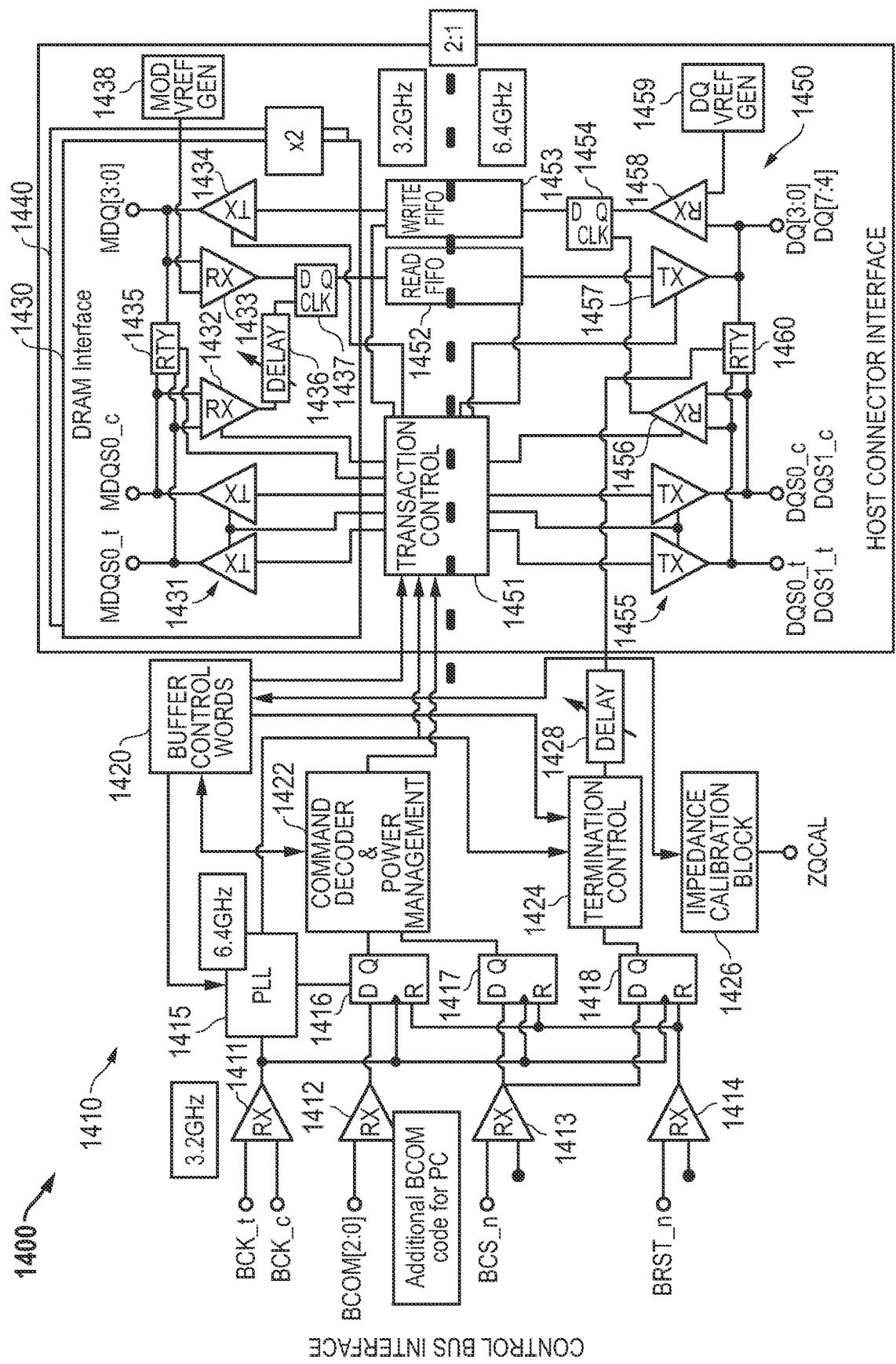
FIG. 14 illustrates in mixed circuit and block diagram from a module data buffer (MDB) according to some embodiments.

FIG. 14 illustrates in mixed circuit and block diagram from a module data buffer (MDB) 1400 according to some embodiments. MDB 1400 is generally embodied in an MDB chip on an HB-DIMM module, and is suitable for use in the HB-DIMMs of FIG. 3, FIG. 5, FIG. 6, FIG. 16, and other HB-DIMM module configurations herein. MDB 1400 generally includes a buffer controller 1410, a first DRAM interface 1430, a second DRAM interface 1440, and a host connector interface 1450.

Buffer controller 1410 has a first pair of differential clock inputs labelled "BCK_t" and "BCK_c", a control bus input labelled "BCOM[2:0]", a chip select input labelled "BCS_n", a reset input labelled "BRST_n", an impedance calibration output labelled "ZQCAL", and a number of outputs connected to host connector interface 1450.

DRAM interfaces 1430 and 1440 each have a differential pair of data strobe input/outputs labelled "MDQS0_t" and "MDQS0_c", and a DRAM data bus input/output labelled MDQ[3:0], an reference voltage input, and a number of input outputs connected to host connector interface 1450. Host connector interface 1450 has a first differential pair of data strobe input/outputs labelled "DQS0_t" and "DQS0_c", a second differential pair of data strobe input/outputs labelled "DQS1_t" and "DQS1_c", and a DRAM data bus input/output labelled "DQ[3:0], DQ[7:4]" (separated by lower and upper nibble as shown to use separate data strobe signals for the upper and lower nibbles). Host connector interface 1450 also has a number of connections to buffer controller 1410, as further described below.

Generally, MDB 1400 receives control signals over the buffer command bus for synchronizing operation of the MDBs in fulfilling memory access commands. MDB 1400 implements an additional BCOM (buffer command) code to identify the pseudo-channel for each command, and based on that BCOM code selects which of DRAM interfaces 1430 or 1440 are used. Similarly, for configurations that provide a quad-rank capability for the HB-DIMM, MDB implements selecting logical ranks of devices based on the additional BCOM code, for example as depicted in FIG. 9. As shown by the label "Additional BCOM code for PC", MDB 1400 receives and implements a command code indicating a pseudo-channel selection for a memory access command based on the CID bit for the memory access command by host connector interface 1450 and one of DRAM interfaces 1430 or 1440 to connect to DRAM chips for the indicated pseudo-channel.

DRAM interfaces 1430 and 1440 each connect to DRAM chips on the HB-DIMM. For configurations supporting pseudo-channels, DRAM interface 1430 connects to a DRAM chips for a first pseudo-channel, and second DRAM interface 1440 connects to DRAM chips for a second pseudo-channel. As shown, host connector interface 1450 operates a clock rate twice that of DRAM interfaces 1430 and 1440 and the control bus, in this example 6.4 GHz versus 3.2 GHz. Generally, an HB-DIMM includes a number of MDBs 1400, which operates responsive to commands from the MRCD to transmit and receive data from and to the DRAM chips over the host bus at the data rate of the DRAM chips.

Buffer controller 1410 includes a differential receiver 1411, a number of other receivers 1412, 1413, and 1414, a PLL 1415, a number of latches 1416, 1417, and 1418, a buffer control words block 1420, a command decoder and power management block 1422, a termination control block 1424, an impedance calibration block 1426, and a delay element 1428. Differential receiver 1411 receives a buffer block signal (generally BCK) from the MRCD and provides it to PLL 1415, and to latches 1416, 1417, and 1418. In this implementation, PLL 1415 includes a frequency multiplier to provide a clock signal for operating circuits within MDB 1400 at double the frequency of BCK, as shown by the example frequencies of 3.2 GHz for BCK and 6.4 GHz for the output of PLL 1415. Receiver 1412 receives the control bus input BCOM[2:0] and feeds it to latch 1416, which forwards it to command decoder and power management block 1422. Receiver 1413 receives the chip select input BCS_n and feeds it to latches 1417 and 1418, which then feeds it to block 1422. Receiver 1414 receives the reset input BRST_n and feeds it to the reset input of latch 1418.

Command decoder and power management block 1422 has an input receiving the control bus signals on input BCOM[2:0], an input receiving the chip select signal on input BCS_n, a bidirectional connection to buffer control words block 1420, and an output connected to a transaction controller 1451 of host connection interface 1450. Buffer control words block 1422 has a bidirectional connection to command decoder and power management block 1422, an output connected to termination control block 1424, a bidirectional connection to impedance calibration block 1426, and an output connected to transaction control block 1451.

Termination controller 1424 generally controls a termination resistance 1460 of host connector interface 1450. Termination controller 1424 has a first input connected to the output of latch 1418, a second input connected to PLL 1415, and a third input connected to buffer control words block 1420. Impedance calibration block 1426 has a bidirectional connection to buffer control words block 1420, and an output providing a signal to impedance calibration output ZQCAL.

DRAM interfaces 1430 and 1440 each include a pair of differential transmitters 1431, a differential receiver 1432, a termination resistance 1435, a receiver 1433, a transmitter 1434, a delay element 1436, and a latch 1437. Differential transmitters 1431 each have an input connected to a respective output transaction controller 1451, a control input connected to an output of transaction controller 1451, and an output connected to the input/outputs MDQS0_t and MDQS0_c, respectively. Differential receiver 1432 has two inputs connected to the input/outputs MDQS0_t and MDQS0_c, respectively, an enable input connected to transaction controller 1451, and an output connected to a clock input of latch 1437 through delay element 1436. Termination resistance 1435 selectively applies a termination to input/outputs to MDQS0_t and MDQS0_c, and MDQ[3:0]. Receivers 1433 (only one of four is shown) each have an input connected to input/output MDQ[3:0], an input connected to a MDQ reference voltage generation circuit 1438, and an output coupled to a read first-in-first-out buffer 1452 through latch 1437. Transmitters 1434 (only one is shown) each have an input connected to write FIFO buffer 1453, an output connected to input/output MDQ[3:0], and an enable input connected to transaction controller 1451.

Host connector interface 1450 includes transaction controller 1451, read FIFO buffer 1542, write FIFO buffer 1453, a pair of differential transmitters 1455, a differential receiver 1456, a termination resistance 1460, a transmitter 1457, a receiver 1458, a latch 1454. Differential transmitters 1455 each have an input connected to a respective output transaction controller 1451, a control input connected to an output of transaction controller 1451, and an output connected to the input/outputs DQSn_t and DQSn_c, respectively ("n" here indicates 0 or 1 to show that a separate DQS signal is provided for the lower and upper nibbles of the data byte handled by MDB 1400). Only one transmitter/receiver paid is shown for DQS in order to simplify the drawing. Differential receiver 1456 two inputs connected to the input/outputs MDQS0_t and MDQS0_c, respectively, an enable input connected to transaction controller 1451, and an output connected to a clock input of latch 1454. Termination resistance 1460 selectively applies a termination to input/outputs DQSn_t and MDQSn_c, and DQ[3:0], DQ[7:4]. Receivers 1458 (only one of eight is shown) each have an input connected to input/output DQ[3:0], DQ[7:4] an input connected to a MDQ reference voltage generation circuit 1459, and an output coupled to a write FIFO buffer 1452 through latch 1454. Transmitters 1457 (only one is shown) each have an input connected to read FIFO buffer 1453, an output connected to input/output MDQ[3:0], and an enable input connected to transaction controller 1451.

As depicted, DRAM interfaces 1430 and 144 operate at half the frequency of DCK. In operation, commands from an MRCD on the HB-DIMM are received over input BCOM [2:0], and decoded by command decoder and power management block 1422. The command decoder interprets the received command, and accesses buffer control word block 1420 to provide a suitable control word for transaction controller 1451. Responsive to the buffer control words, transaction controller 1451 configures the various transmitters, receivers, and buffers to either receive read data over one of DRAM interfaces 1430 and 1440 and transmit it over the host connector interface at twice the DRAM data rate, or receive write data over the host connector interface and write it to DRAM over one of DRAM interfaces 1430 or 1440 at half the data rate it was received. Command decoder and power management circuit 1422 implements decode logic to map CID and CS bits to DRAM chips as shown, for example, in FIG. 9, in order to implement pseudo-channel configurations or quad-rank configurations as described above.

Figure 15:
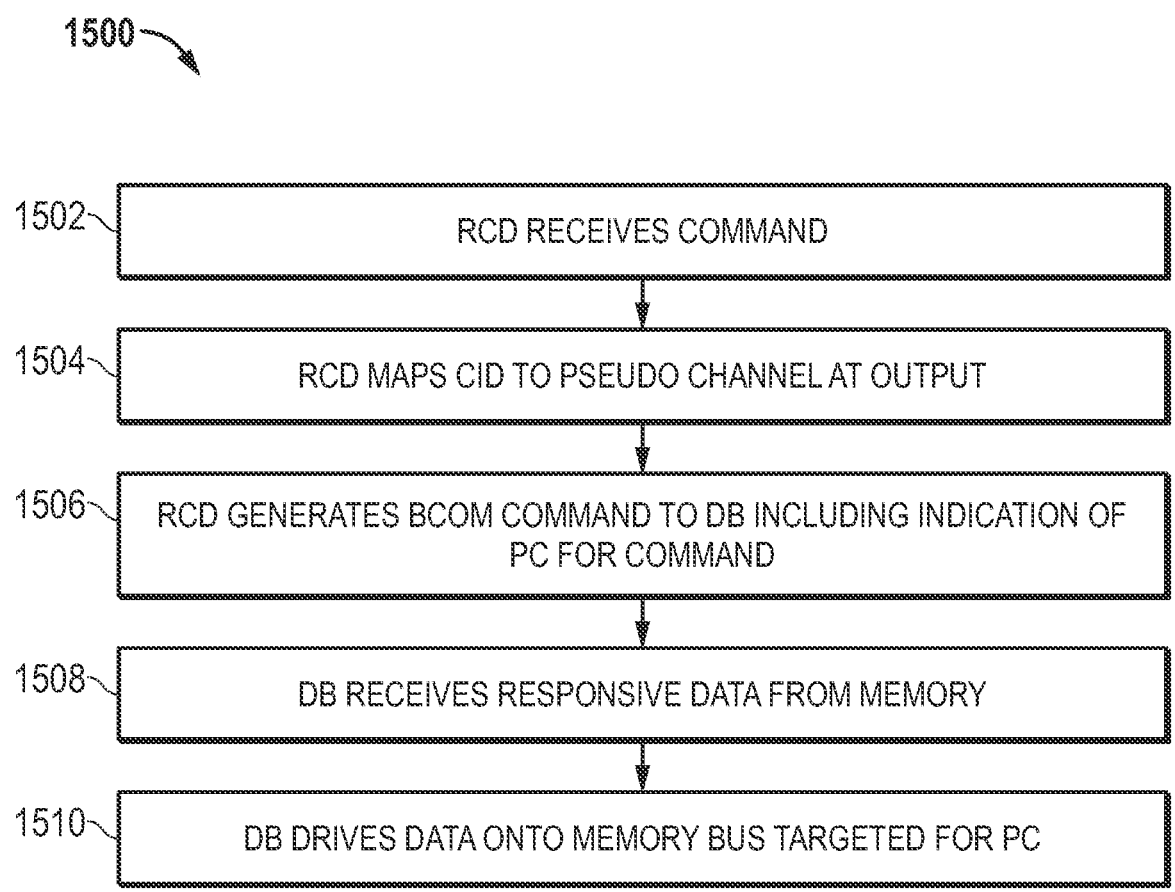
FIG. 15 shows a flowchart for a process of operating an HB-DIMM according to some embodiments.

FIG. 15 shows a flowchart 1500 for a process of operating an HB-DIMM according to some embodiments. The depicted process is suitable for use with those HB-DIMM configurations provided herein that employ pseudo-channels.

At block 1502, the process includes at a register clock driver (RCD) receiving a memory access command over a memory interface bus. At block 1504, based on a chip identifier (CID) bit of the C/A signal for the command, the RCD maps the memory access command to a selected memory chip of a plurality of memory chips providing at least two pseudo-channels. The RCD routes command/address (C/A) signals for the memory access command to the selected memory chip.

At block 1506, the RCD prepares and transmits a data buffer command code (BCOM) indicating a pseudo-channel associated with a selected memory access command for which the command is to be fulfilled. Generally, block 1506 may be performed concurrently with block 1504.

At block 1508, the data buffer is configured according to the data buffer command code and receives responsive data from memory. Then at block 1510, the received data is driven onto the host memory interface bus on the appropriate data pins targeted for the specified pseudo-channel.

While a sequence including reading from the memory is shown, the same process applies in the reverse direction for write commands.

Generally, the process of operating an HB-DIMM according to the implementations described herein may include receiving and fulfilling a plurality of memory access commands, where the RCD circuit does not re-order the plurality memory access commands from the order of commands received from the host bus. As described above with respect to FIG. 7 and FIG. 8, the process in some implementations may include transmitting read responses for the at least two pseudo-channels over the memory interface bus in a non-interleaved format.

According to some implementations, the method may include entering a training mode with a different mapping of ranks. There is an issue that known HB-DIMM designs in that cannot properly train the four ranks of the quad-rank modules due to hardware constraints, because current hardware is limited to comprehend only two ranks. According to some embodiments, a mode is added to the RCD and DB circuits of the various embodiments herein whereby during training, each of the two host-side CS inputs is assigned to map to one of the two backside ranks to avoid the logical rank limitation. During training, the process is able change the mode to progress to all four ranks. In normal mode, the process employs the CS/CID signals to address the ranks.

Figure 16:
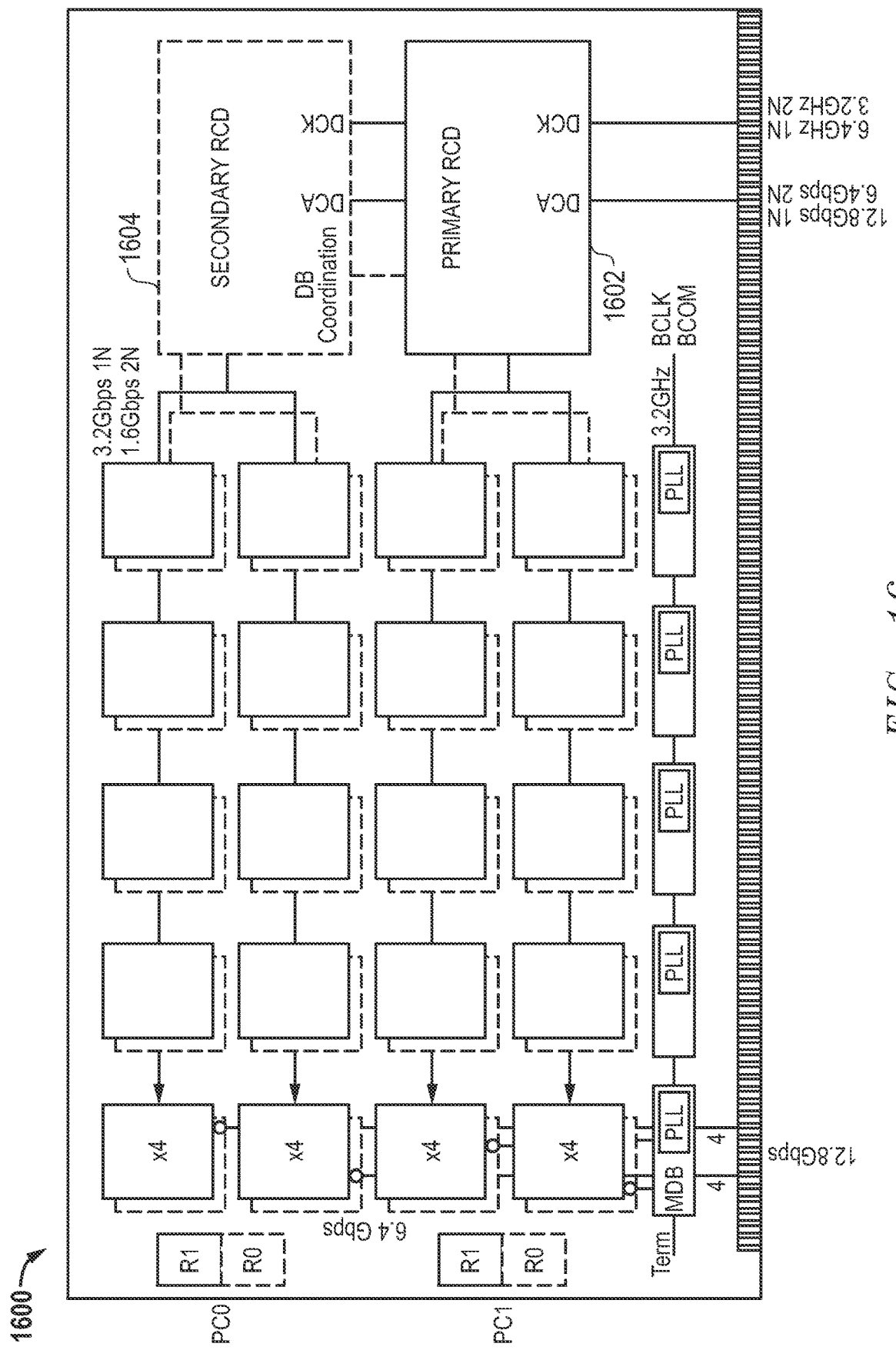
FIG. 16 illustrates in block diagram form an HB-DIMM according to some additional embodiments.

FIG. 16 illustrates in block diagram form an HB-DIMM 1600 according to some embodiments. Generally, HB-DIMM 1600 is arranged in a two-ranks per pseudo-channel arrangement like that of FIG. 5, but includes two RCDs rather than a single RCD. In particular, HB-DIMM 1600 has a primary RCD 1602 and a secondary RCD 1604.

Generally, proposed HB-DIMM configurations suffer from an issue related to the loading of signals. The problem is related to the expansion of capacity and the related double loading on all the module signals. To help overcome this problem, a second RCD buffer is added. This addition puts more load on the external host-facing interface, but that additional loading is likely acceptable. An additional problem addressed by the implementation of FIG. 16 is the connectivity between the RCD buffer and the DBs. The DBs are controlled by the RCD. Using two RCDs, however, the HB-DIMM module determines which one controls the data buffers by designating a primary RCD and a secondary RCD. Both RCDs are connected to the host interface and therefore are aware of what commands are implemented by the other RCD. This allows the primary RCD to control the DBs for both itself and the secondary, while the secondary RCD communicates with the DRAM chips for PC1. Another method to solve the problem is to add an auxiliary communication bus between the RCDs. Such a configuration is depicted by the optional bidirectional connection labelled "DB Coordination", however it requires more resources than the first solution.

The HB-DIMM 1600 RCD circuit employs primary RCD 1602 for implementing commands to a first set of the DRAM chips for first one of the pseudo-channels (PC0), and secondary RCD 1604 for implementing commands to a second set of DRAM chips for the second one of the pseudo-channels. Primary RCD 1602 controls the data buffer chips (MDB) to direct transmitting data for the first and second pseudo-channels, while secondary RCD 1604.

An integrated circuit or integrated circuits containing the reference voltage generation circuits described herein, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the particular timing of commands as depicted in FIGS. 4, 7, and 8 may be varied. Furthermore, various features herein may be employed in various sub-combinations. An RCD may be embodied in a circuit as a single RCD chip or a cooperating pair of RCDs. HB-DIMMs may be constructed with RCD and DB circuits that are programmable to change modes between the quad-rank configurations and pseudo-channel configurations herein, or may be constructed to perform only one or the other.

Accordingly, it is intended by the appended claims to cover all modifications of the disclosed embodiments that fall within the scope of the disclosed embodiments.

What is claimed is:

1. A high-bandwidth dual-inline memory module (HB-DIMM) adapted for coupling to a host bus and comprising:
   a plurality of memory chips;
   a plurality of data buffer chips coupled to respective sets of the memory chips and capable of transmitting data from the memory chips over a host bus at a data rate twice that of the memory chips; and
   a register clock driver (RCD) circuit including a host bus interface for coupling to the host bus and a memory interface coupled to the plurality of memory chips, the RCD circuit capable of implementing memory access commands received over the host bus by routing command/address (C/A) signals to the memory chips for providing at least two independently addressable pseudo-channels, the RCD circuit addressing each respective pseudo-channel based on a chip identifier (CID) bit derived from the C/A signals.

2. The HB-DIMM of claim 1 wherein the RCD circuit does not re-order memory access commands received over the host bus.

3. The HB-DIMM of claim 1 wherein the RCD circuit causes read responses for the at least two independently addressable pseudo-channels to be transmitted over the host bus in a non-interleaved format.

4. The HB-DIMM of claim 1 wherein:
   the RCD circuit is also capable of implementing memory access commands received over the host bus by routing C/A signals to the memory chips in a quad-rank (QR) format; and
   the plurality of data buffer chips, responsive to commands from the RCD, are capable of transmitting data from the memory chips over the host bus at the data rate of the memory chips.

5. The HB-DIMM of claim 1 wherein the RCD circuit is programmable to operate in a first mode in which a data clock (DCK) and C/A pins of the host bus operate at a half-rate (2N) speed with the C/A pins operated in a double-data-rate (DDR) mode, and a second mode in which the DCK pins of the host bus operate at a full-rate (1N) speed with the C/A pins of the host bus operated in a single-data-rate (SDR) mode.

6. The HB-DIMM of claim 1 wherein the RCD circuit produces and transmits a command code to at least one of the data buffer chips indicating a pseudo-channel selection for a memory access command based on the CID bit for the memory access command.

7. The HB-DIMM of claim 1 wherein the RCD circuit includes a first RCD for distributing commands to a first set of the memory chips, and a second RCD for implementing commands to a second set of memory chips, wherein one of the first and second RCDs acts as a primary RCD for controlling the data buffer chips for transmitting data for both sets of memory chips over the host bus.

8. The HB-DIMM of claim 1 wherein the RCD circuit supports a directed refresh management (DRFM) command by translating a precharge per-bank (PREpb) signal to a precharge per-bank signal for a first one of the pseudo-channels, and translating a signal on a reserved for future use (RFU) bit derived from the C/A signals to a PREpb signal for a second one of the pseudo-channels.

9. A method of operating a high-bandwidth dual-inline memory module (HB-DIMM) comprising:
at a register clock driver (RCD) circuit, receiving a memory access command over a memory interface bus;
at the RCD circuit, routing command/address (C/A) signals for the memory access command to a selected memory chip in a plurality of memory chips for providing at least two independently addressable pseudo-channels, the RCD circuit addressing each respective pseudo-channel based on a chip identifier (CID) bit of the C/A signals; and
at the RCD circuit, preparing a data buffer command code indicating a pseudo-channel associated with a selected memory access command for which the memory access command is to be fulfilled.

10. The method of claim 9 further comprising receiving and fulfilling a plurality of memory access commands wherein the RCD circuit does not re-order the plurality of memory access commands from an order of commands received from the memory interface bus.

11. The method of claim 9 further comprising transmitting read responses for the at least two independently addressable pseudo-channels over the memory interface bus in a non-interleaved format.

12. The method of claim 9 wherein the RCD circuit is programmable to operate in a first mode in which a data clock (DCK) and C/A pins of the memory interface bus operate at a half-rate (2N) speed with the C/A pins operated in a double-data-rate (DDR) mode, and a second mode in which the DCK pins of the memory interface bus operate at a full-rate (1N) speed with the C/A pins of the memory interface bus operated in a single-data-rate (SDR) mode.

13. The method of claim 9, wherein the RCD circuit includes a first RCD for implementing commands to a first set of the memory chips for a first one of the pseudo-channels, and a second RCD for implementing commands to a second set of memory chips for a second one of the pseudo-channels, wherein one of the first and second RCDs acts as a primary RCD for controlling a plurality of data buffer chips for transmitting data for the first one of the pseudo-channels and the second one of the pseudo-channels.

14. A data processing system comprising:
a host bus;
a memory controller coupled to the host bus for fulfilling memory access commands over at least two independently addressable pseudo-channels;
a high-bandwidth dual-inline memory module (HB-DIMM) coupled to the host bus and comprising:
a plurality of memory chips;
a plurality of data buffer chips coupled to the memory chips and capable of transmitting data from the memory chips over a host bus at a data rate twice that of the memory chips; and
a register clock driver (RCD) circuit including a host bus interface for coupling to the host bus and a memory interface coupled to the plurality of memory chips, the RCD circuit implementing memory access commands received over the host bus by routing command/address (C/A) signals to the memory chips for the at least two independently addressable pseudo-channels, the RCD circuit addressing each respective pseudo-channel based on a chip identifier (CID) bit of the C/A signals.

15. The data processing system of claim 14 wherein the RCD circuit does not re-order memory access commands received over the host bus.

16. The data processing system of claim 14 wherein the RCD circuit causes read responses for the at least independently addressable two pseudo-channels to be transmitted over the data bus in a non-interleaved format.

17. The data processing system of claim 14 wherein the RCD circuit is programmable to operate in a first mode in which a data clock (DCK) and C/A pins of the host bus operate at a half-rate (2N) speed with the C/A pins operated in a double-data-rate (DDR) mode, and a second mode in which the DCK pins of the host bus operate at a full-rate (1N) speed with the C/A pins of the host bus operated in a single-data-rate (SDR) mode.

18. The data processing system of claim 14 wherein the RCD circuit produces and transmits a command code to at least one of the data buffer chips indicating a pseudo-channel selection for a memory access command based on the CID bit for the memory access command.

19. The data processing system of claim 14 wherein the RCD circuit includes a first RCD for implementing commands to a first set of the memory chips, and a second RCD for implementing commands to a second set of memory chips, wherein one of the first and second RCDs acts as a primary RCD for controlling the data buffer chips for transmitting data for both sets of memory chips.

20. The data processing system of claim 14, wherein the memory controller is programmable to act in a first mode in which it accesses the HB-DIMM to address pseudo-channels based on the CID bit, and a second mode in which it accesses a different HB-DIMM to access ranks of memory chips based on the CID bit.

21. The data processing system of claim 14, wherein:
the HB-DIMM comprises a first half providing a first memory channel including a first set of the plurality of memory chips, and a second half providing a second memory channel including a second set of the plurality of memory chips; and
the memory controller provides a first data clock (DCK) signal for the first memory channel and a second DCK signal for the second memory channel.

* * * * *